(12) United States Patent
Liu et al.

(10) Patent No.: US 6,639,532 B1
(45) Date of Patent: Oct. 28, 2003

(54) NESTED CHOPPER DELTA-SIGMA MODULATOR

(75) Inventors: Shen-Iuan Liu, Hsinchu (TW);
Chien-Hung Kuo, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/300,450

(22) Filed: Nov. 19, 2002

Related U.S. Application Data

(60) Provisional application No. 60/396,700, filed on Jul. 16, 2002.

(51) Int. Cl.[7] .................................................. H03M 3/00
(52) U.S. Cl. ........................ 341/143; 341/118; 341/172
(58) Field of Search ................................ 341/143, 155, 341/156, 161, 172, 118

(56) References Cited

U.S. PATENT DOCUMENTS

| | | | | |
|---|---|---|---|---|
| 5,262,686 A | * | 11/1993 | Kurosawa | 327/77 |
| 5,477,481 A | * | 12/1995 | Kerth | 708/819 |
| 5,675,334 A | * | 10/1997 | McCartney | 341/118 |
| 5,703,589 A | * | 12/1997 | Kalthoff et al. | 341/172 |
| 6,285,311 B1 | * | 9/2001 | Lewicki | 341/172 |
| 6,400,295 B1 | * | 6/2002 | Van Herzeele | 341/143 |
| 6,411,242 B1 | * | 6/2002 | Oprescu et al. | 341/155 |

* cited by examiner

*Primary Examiner*—Brian Young
*Assistant Examiner*—John Nguyen
(74) *Attorney, Agent, or Firm*—Martine & Penilla, LLP

(57) ABSTRACT

A nested chopper circuit includes a first chopper section, which is coupled to input terminals and is controlled by a pair of non-overlapping clocks, and a second chopper section, which is coupled to the first chopper section and is controlled by a pair of chopper clocks. The pair of non-overlapping clocks is a multiple of the pair of chopper clocks, and the non-overlapping clocks are configured to invert on a period continuously. When the pair of chopper clocks ($\phi 11$ and $\phi 12$) controls switches S1, S2, S3, and S4 of the second section, these switches follow the following logic when operated in conjunction with the pair of non-overlapping clocks ($\phi A$ and $\phi B$): switches S1 & S4: $\phi A \cdot \phi 11 + \phi B \cdot \phi 12$; and switches S2 & S3: $\phi A \cdot \phi 12 + \phi B \cdot \phi 11$. A method for chopping an analog input signal for sampling also is described.

20 Claims, 8 Drawing Sheets

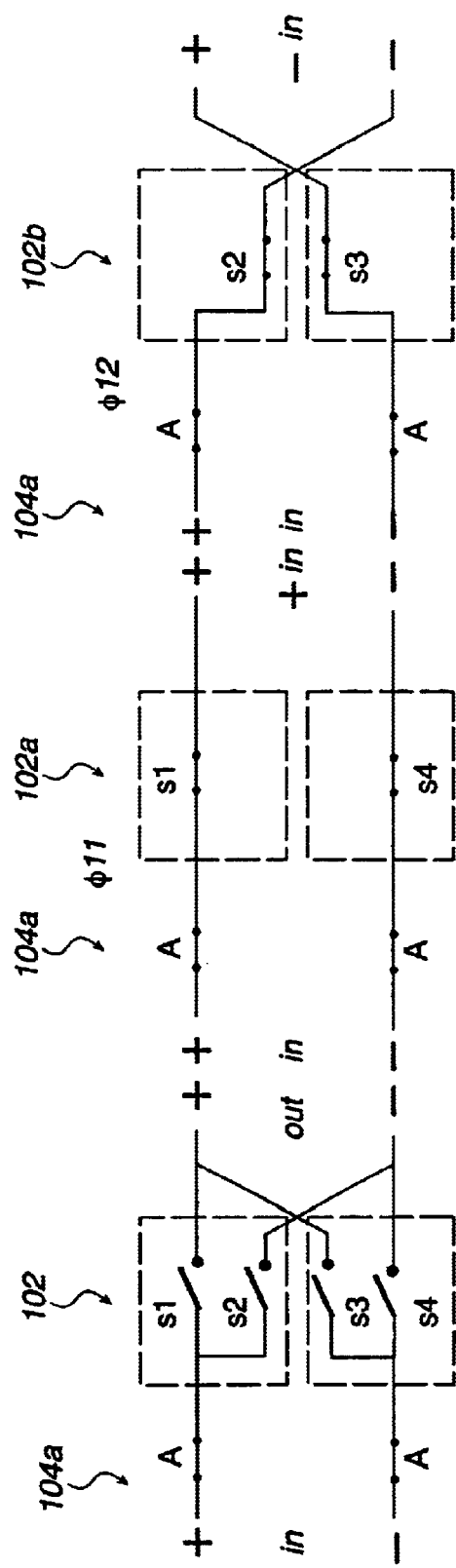
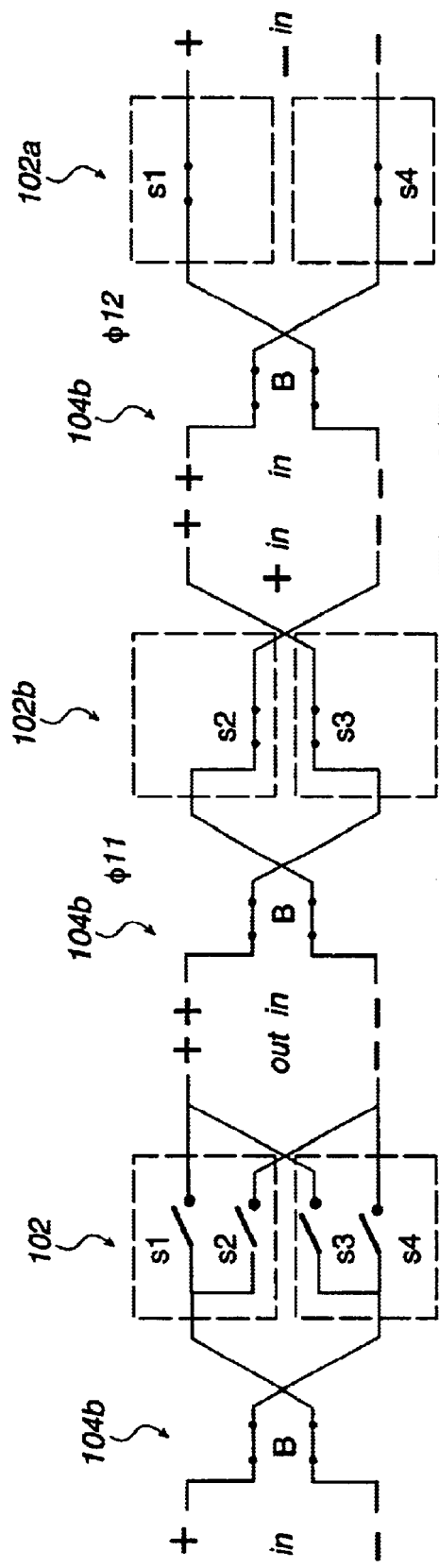
Fig. 2(C)
Fig. 2(D)

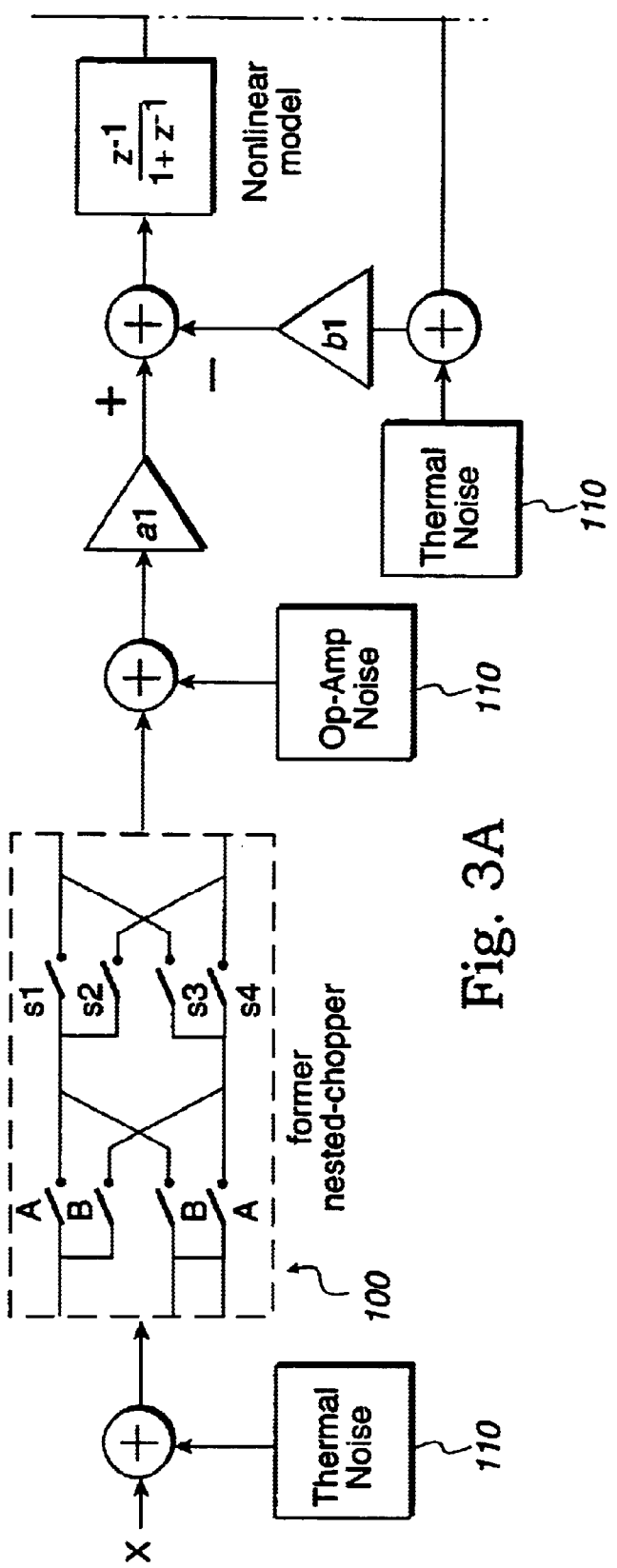

| Fig. 4A |
|---------|
| Fig. 4B |

NESTED CHOPPER DELTA-SIGMA MODULATOR

CLAIM FOR PRIORITY

This application claims priority under 35 U.S.C. § 119(e) from U.S. Provisional Patent Application No. 60/396,700, filed Jul. 16, 2002, and entitled "Nested Chopper Delta-Sigma Modulator." The disclosure of this provisional application is incorporated herein by reference.

BACKGROUND OF THE INVENTION

1. Field of the Invention

The present invention relates generally to circuitry and, more particularly, to chopper circuitry for reducing residual noise caused by a mismatch between input chopper switches.

2. Description of the Related Art

In the application of analog to digital (ADC) converters, the accuracy and feasibility of a delta-sigma modulator (DSM) make it popular for implementation in many circuits, such as audio codec circuits, communication circuits, sensor circuits, and instrumentation circuits. Nevertheless, the performance of the delta-sigma modulator (DSM) is sensitive to input noise, which is caused by switches, operational amplifiers (op amps), and digital circuits, and such noise will degrade the dynamic range of the input signal.

In the low frequency band, the increase in flicker noise is proportional to the decrease in frequency. In the relative-low frequency band, the offset will dominate the noise. Especially in sensor interface circuits, system performance is limited. In the prior art, correlated double sampling, self-calibrating operational amplifiers (op amps), and chopper-stabilized techniques are used to deal with this type of noise. These techniques are generally grouped in two categories one of which is referred to as autozeroing and the other is referred to as chopping. These approaches can also be applied to an amplifier and integrator.

One specific approach is provided by Y. H. Chang, C. Y. Wu, and T. C. Yu, in an article entitled "Chopper-stabilized sigma-delta modulator," *IEEE ISCAS*, pp. 1286–1289, May 1993, the disclosure of which is incorporated herein by reference. The chopper stabilized delta-sigma modulator (DSM) with conventional op amps has been shown to have better immunity from low-frequency noise. Unfortunately, the chopping approach also generates residual noise, which comes from the charge-injection mismatch between the switches during the operation of the chopper. The ON and OFF of the switch induce the spikes into the input end of the delta-sigma modulator (DSM). These high-frequency switching noises will track the input signal and enter the modulator, and hence degrade the resolution and SNDR of the system.

Another specific approach is provided by A. Bakker, K. Thiele, and J. H. Huijsing, in an article entitled "A CMOS nested-chopper instrumentation amplifier with 100-nV offset," *IEEE J. Solid-State Circuits*, vol. 35, no. 12, pp. 1877–1883, December 2000, the disclosure of which is incorporated herein by reference. This article proposes a nested-chopper amplifier to reduce the residual noise. It is believable that if the nested-chopper amplifier is applied to the delta-sigma modulator, the offset of OP AMP and associated low-frequency noise of the modulator can be canceled. However, the front end of the modulator will still suffer from the high-frequency noise caused by the mismatch between the sampling switches.

A further approach is provided by C. B. Wang, in an article entitled "A 20 bit 25 kHz delta-sigma A/D converter utilizing frequency-shaped chopper stabilization scheme," *IEEE custom integrated circuits conference*, pp. 9–12, 2000, the disclosure of which is incorporated herein by reference. A frequency-shaped chopper stabilized delta-sigma A/D converter is described to remove the clock spike noise. The residual noise is rejected by a random chopper clock. The chopper clock is generated by passing a pseudo-random clock through the digital filter which has two zeros located at DC and half sampling frequency. However, the clock noise will not be exhibited at the interest band.

As will be understood by one skilled in the art, the autozeroing approach of the high-frequency noise, which is sampled by an input switch during a sampling period, will be folding back to the interest band. Consequently, the chopping technique is preferred due to its lower noise than the autozeroing technique in the application of a delta-sigma modulator (DSM).

In view of the foregoing, there is a need for circuitry and methods for reducing the introduction of noise when processing sensitive analog-to-digital conversions of input signals.

SUMMARY OF THE INVENTION

Broadly speaking, the present invention fills this need by providing a nested-chopper delta-sigma modulator. By using the disclosed circuit and method, the residual noise caused by the mismatch between input chopper switches can be reduced. It should be appreciated that the present invention can be implemented in numerous ways, including as a process, a system, or a device. Several inventive embodiments of the present invention are described below.

In accordance with one aspect of the present invention, a nested chopper circuit is provided. The nested chopper circuit includes a first chopper section, which is coupled to input terminals and is controlled by a pair of non-overlapping clocks. A second chopper section is coupled to the first chopper section, with the output of the first chopper section leading to an input of the second chopper section. A pair of chopper clocks controls the second chopper section. The pair of non-overlapping clocks is a multiple of the pair of chopper clocks, and the non-overlapping clocks are configured to invert on a period continuously.

In one embodiment, the nested chopper circuit is coupled to a delta-sigma modulator (DSM) circuit. In one embodiment, the continuous inverting on the period provides sampling on positive and negative input signals provided to the input terminals of the first chopper section. In one embodiment, the pair of non-overlapping clocks is $\phi A$ and $\phi B$ and the pair of chopper clocks is $\phi 11$ and $\phi 12$. In one embodiment, the pair of chopper clocks controls switches S1, S2, S3, and S4 of the second section. In one embodiment, switches S1, S2, S3, and S4 follow the following logic when operated in conjunction with the pair of non-overlapping clocks: switches S1 & S4: $\phi A \cdot \phi 11 + \phi B \cdot \phi 12$; and switches S2 & S3: $\phi A \cdot \phi 12 + \phi B \cdot \phi 11$.

In another embodiment, the first chopper portion has two outer switches and two inner switches, with the outer switches being controlled by a first non-overlapping clock and the inner switches being controlled by a second non-overlapping clock. In this embodiment, the second chopper section has four switches that are controlled by a pair of chopper clocks. The first and second non-overlapping clocks are each multiples of the pair of chopper clocks. In addition, the first and second non-overlapping clocks are configured to invert on a period continuously, with the inverting of the first non-overlapping clock being in opposite phase from the second non-inverting clock.

In accordance with another aspect of the present invention, a method for chopping an analog input signal for sampling is provided. In this method, an input signal is received. A pair of non-overlapping clocks is provided to a first chopper section. The non-overlapping clocks are configured to invert on a period continuously. A pair of chopper clocks is provided to a second chopper section. The non-overlapping clocks are multiples of the pair of chopper clocks. The input signal is processed through the first chopper section and the second chopper section, and the continuous inverting on the period provides sampling on a positive cycle and a negative cycle of the input signal.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIGS. 2(c) and 2(d) illustrate the operation of the switches when operated in conjunction with the pair of non-overlapping clocks and the chopper clocks.

DETAILED DESCRIPTION OF THE PREFERRED EMBODIMENTS

An invention is described for a nested-chopper delta-sigma modulator. Specific details of several embodiments of the present invention are described below. It will be obvious to one skilled in the art, however, that the present invention may be practiced without some or all of these specific details. In other instances, well known process operations have not been described in detail to avoid obscuring the present invention unnecessarily.

Figure 1:
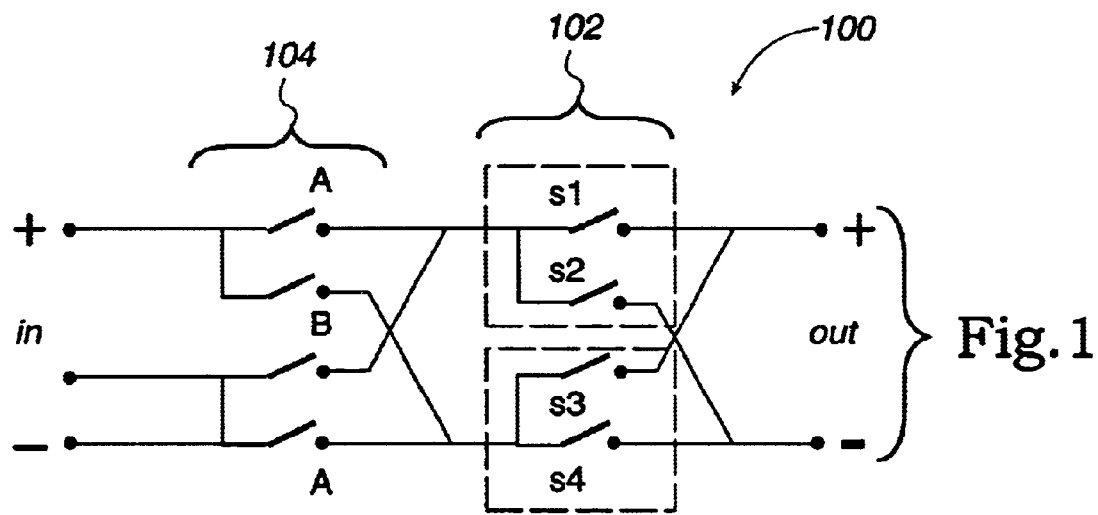
FIG. 1 is a circuit diagram of a nested-chopper delta-sigma modulator in accordance with one embodiment of the present invention

A nested-chopper 100 delta-sigma modulator, as shown in FIG. 1 is provided, in accordance with one embodiment of the present invention. In the circuit, as shown in FIG. 1, a nested chopper 100 includes switches A and B controlled by two non-overlapped clocks $\phi A$ and $\phi B$, which periods are multiple of chopper period. A latter chopper 100' (shown in FIGS. 3 and 4), is controlled by the clocks $\phi 11$ and $\phi 12$. The nested chopper 100 includes a first chopper section 104 that is coupled to input terminals. The first chopper section is controlled by the pair of non-overlapping clocks $\phi A$ and $\phi B$. The second chopper section 102 is being coupled to the first chopper section 104. The output of the first chopper section 104 leads to an input of the second chopper section 102, and the second chopper section is controlled by the pair of chopper clocks $\phi 11$ and $\phi 12$. As will be described below, the pair of non-overlapping clocks is a multiple of the pair of chopper clocks, and the non-overlapping clocks are configured to continuously invert on a period.

Figure 2A:
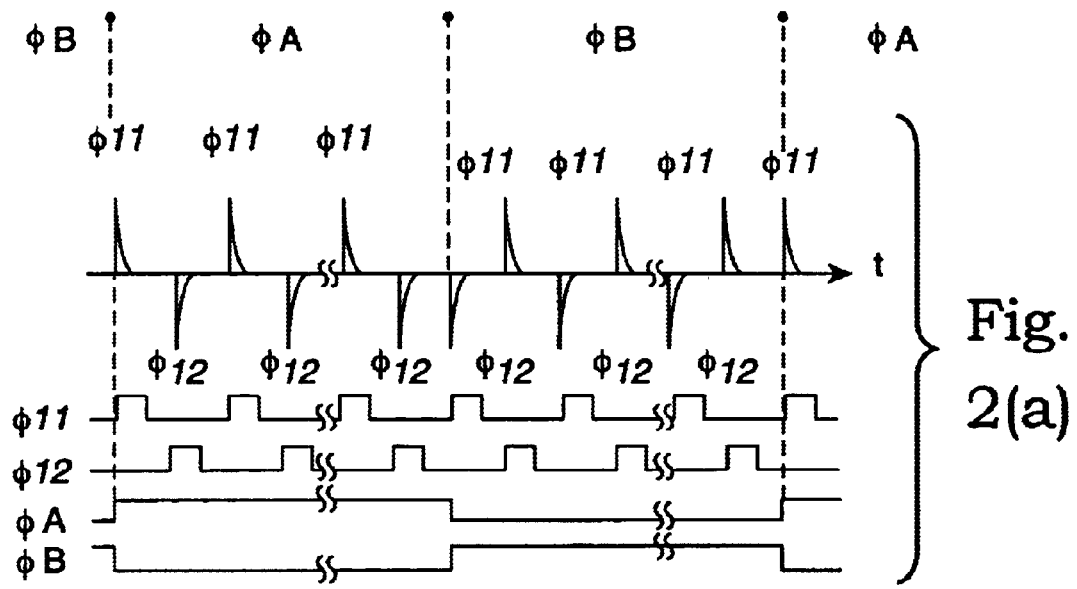
FIG. 2(a) shows the operation of the pair of non-overlapping clocks in relation to the chopper clocks.
Figure 2B:
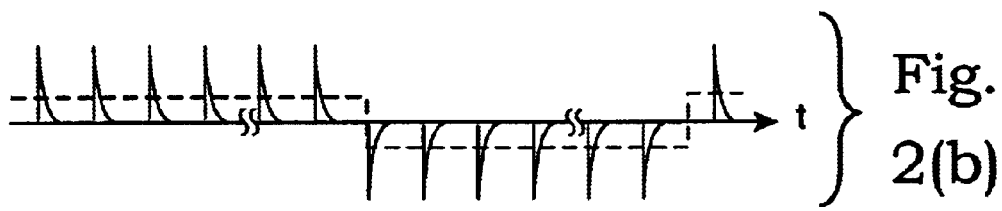
FIG. 2(b) shows the resulting spikes after demodulation by another chopper.

The corresponding spikes are shown in FIG. 2(a). The resulting spikes after demodulation by another chopper are drawn in FIG. 2(b). In view of prior art, a nested-chopper with conventional clocks cannot be directly connected to the front of the modulator because double frequency shifting of the input signal is performed before entering the modulator. Accordingly, a nested-chopper 100 for use in a delta-sigma modulator (DSM), which is based on the known chopper-stabilized technique is disclosed herein.

First, the input signal is modulated to the high frequency band by the former chopper. Second, transmitting the signal into high-frequency-noise shaping of a delta-sigma modulator, and demodulating this signal by the following chopper circuits. To overcome the residual noise caused by the former chopper, a nested chopper 100 delta-sigma modulator (DSM) of FIG. 1 is provided. In a preferred embodiment, the noise spikes, which are caused by the chopper switches, are reversed in a certain tunable period. Hence, the average residual noise is reduced or eliminated, and the SNR (signal to noise ratio) of the modulator is improved.

As illustrated in the timing diagram of FIG. 2(a), the positive and negative signals are input the modulator in an alternating manner. Thus, when $\phi A$ is ON, the control signal of the switches s1 and s4 is $\phi 11$, and the control signal of the switches s2 and s3 is $\phi 12$. The states of the switches are as described with reference to FIGS. 2(c) and 2(d).

In order to maintain the function of a chopper-stabilized modulator, the clocks of the nested-chopper scheme are modified in accordance with the present invention. Accordingly, when phase $\phi A$, shown as 104a, is ON, the nested-chopper 100 will function as does a single chopper circuit. To illustrate this, reference is made to FIG. 2(c). Switches s1 and s4, shown as 102a, are ON in phase $\phi 11$, and switches s2 and s3, shown as 102b, are ON in phase $\phi 12$. Reference is now made to FIG. 2(d), where phase $\phi B$, shown as 104b, is ON. To keep sampling the positive and negative input signals alternatively, switches s2 and s3, shown as 102b, are ON in phase $\phi 11$, and switches s1 and s4, shown as 102a, are ON in phase $\phi 12$. The control logic of the switches s1, s2, s3, and s4 is listed as follows:

Switches S1 & S4: $\phi A \cdot \phi 11 + \phi B \cdot \phi 12$; and

Switches S2 & S3: $\phi A \cdot \phi 12 + \phi B \cdot \phi 11$.

The nested chopper 100 delta-sigma modulator (DSM) can therefore reduce the residual noise, and provides for lower low-frequency noise. As will be appreciated by one skilled in the art, the nested chopper 100 DSM is suitable for general CMOS integration due to the simplicity in architecture and operation.

Figure 3B:
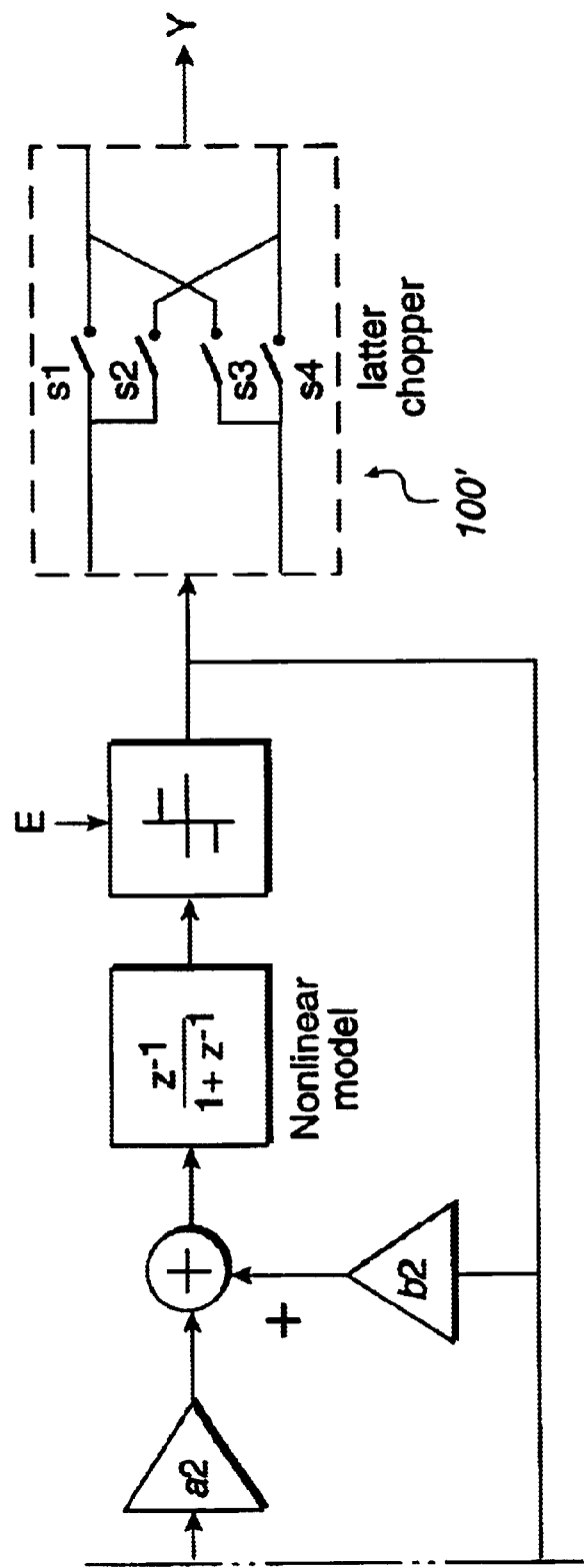
FIG. 3 is an exemplary block diagram of a second-order nested-chopper delta-sigma modulator (DSM), with thermal noise and operational amplifier noise.

FIG. 3 illustrates an exemplary block diagram of a second-order nested-chopper delta-sigma modulator (DSM), with thermal noise and operational amplifier noise. Thermal noise and the op amp's noise of the first resonator and the nonlinear outputs of the op amp are considered illustrated, as noise 110. The nested-chopper 100, operated as described above is shown before the first operational amplifier of the DSM.

Figures 4, 4A:
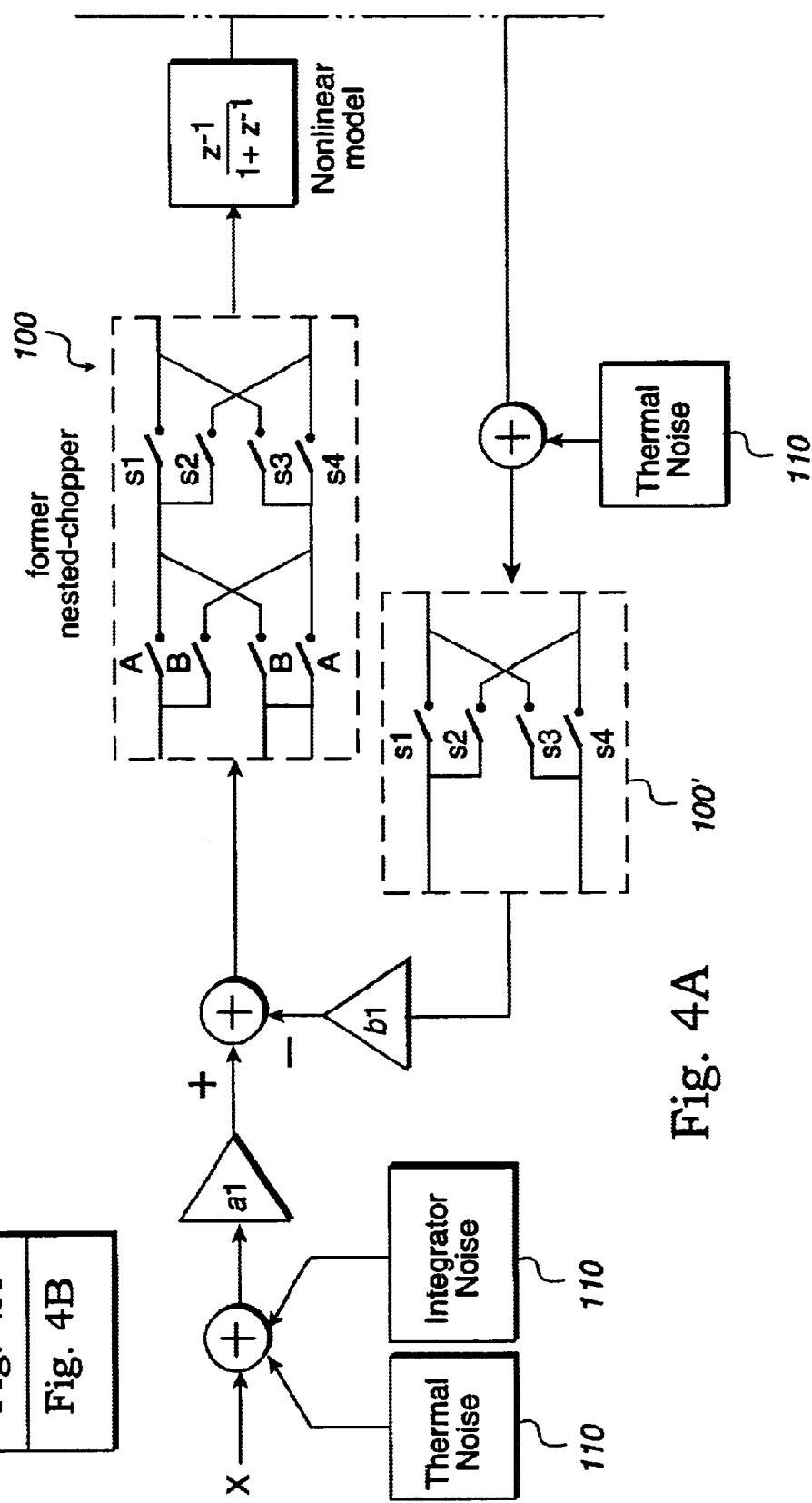
FIG. 4 is another exemplary block diagram of a second-order nested-chopper delta-sigma modulator (DSM), with thermal noise and operational amplifier noise.
Figure 4B:
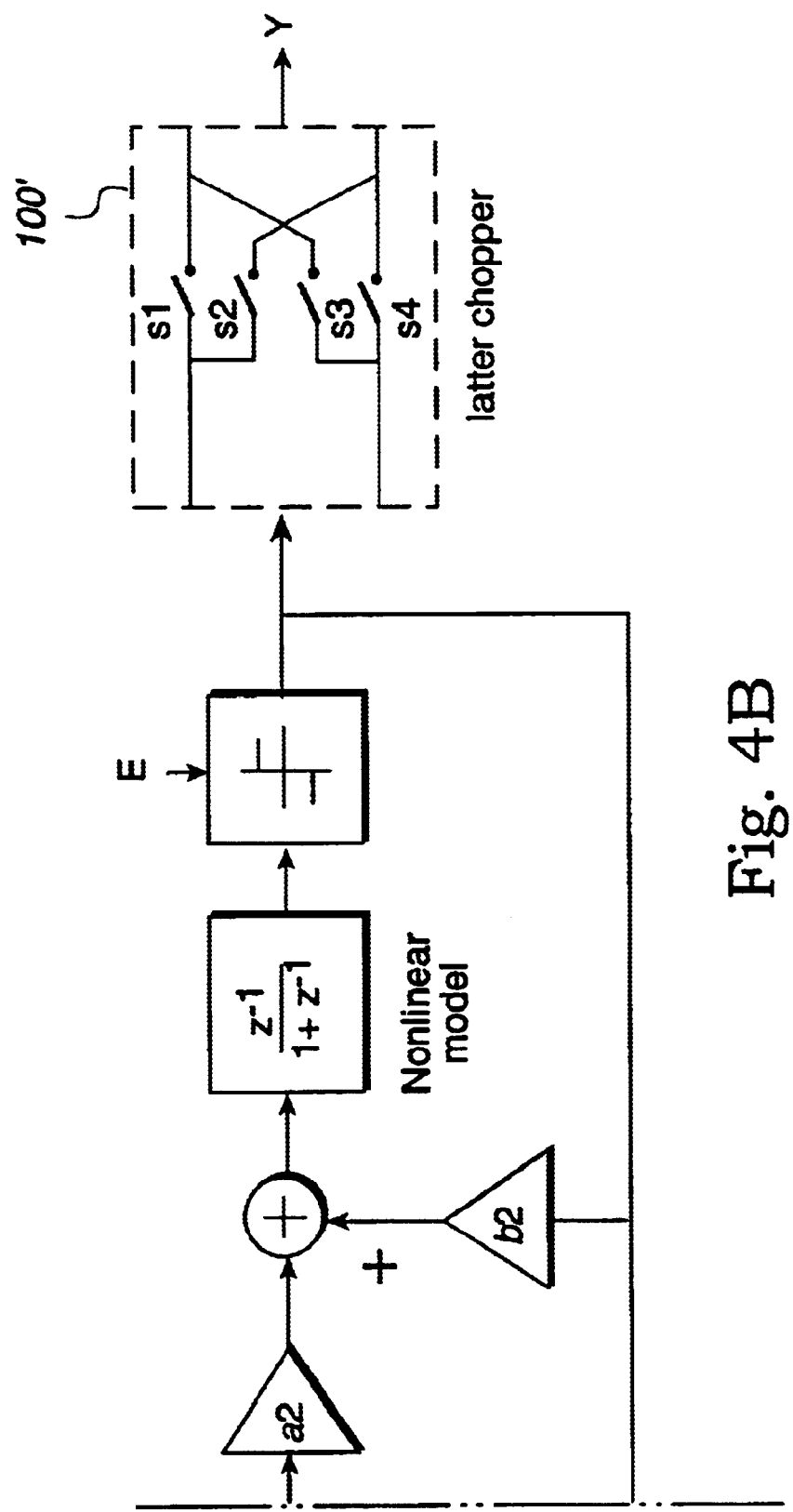

The same function can be achieved if the nested-chopper 100 is moved to the input of the op amp as shown in FIG. 4. In a preferred embodiment, the switches can be simplified to single-NMOS switches due to the virtual ground input of the op amp. However, the feedback should include chopper-like logic to correct the sign of the feedback.

Figure 5:
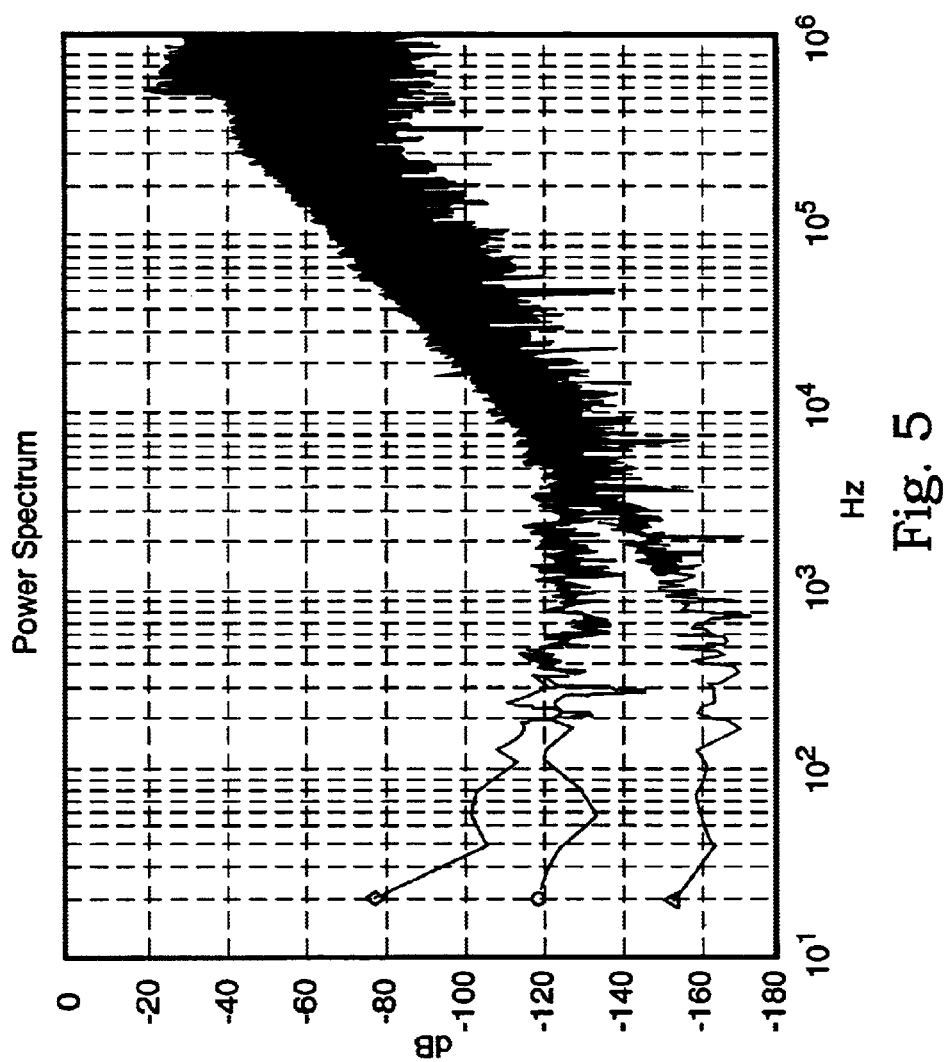
FIG. 5 is a plot of dB versus Hz that shows the results of a simulation of a second-order DSM with −6 dB, 5.78125 kHz input signal, sampling frequency of 2.56 MHz, and 0.5 $\mu$V peak value of the chopper spikes.

Simulation of a second-order DSM with −6 dB, 5.78125 kHz input signal, sampling frequency of 2.56 MHz, and 0.5 μV peak value of the chopper spikes is shown in FIG. 5. Three cases are shown in this drawing. The first, illustrated by a "◊," is a chopper stabilized DSM with residual noise, as taught by the prior art. The second, illustrated by a "○," is a nested-chopper DSM with residual noise, in accordance with one embodiment of the present invention. The third, illustrated by a "Δ," is an ideal chopper stabilized DSM without residual noise and the noises mentioned above.

Figure 6:
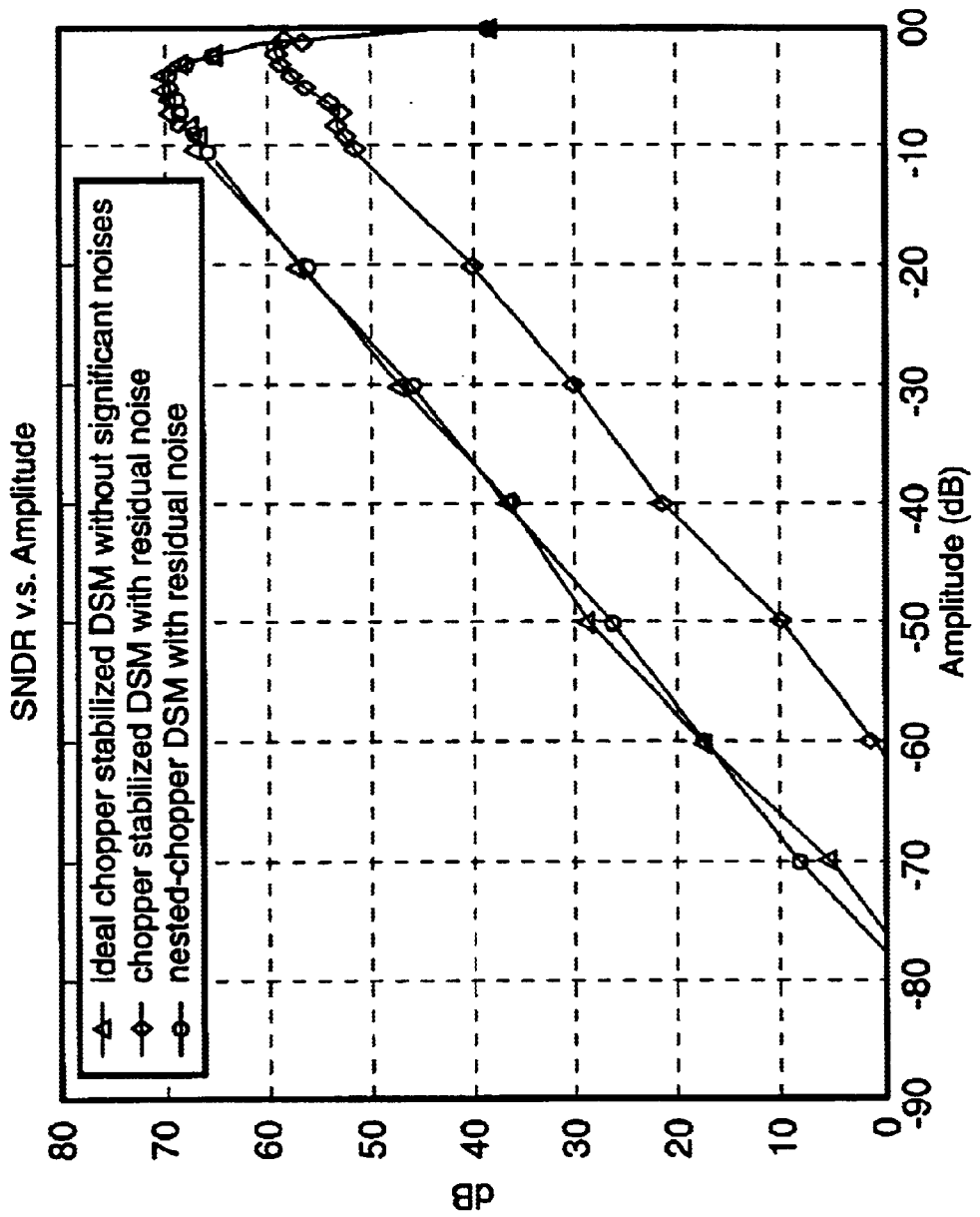
FIG. 6 is a plot of SNDR (signal-to-noise-and-distortion ratio) versus input amplitude.

As shown, the residual noise of the second case (i.e., case "○" of the present invention) is lower than the first toward the relative-low frequency band. In accordance with the circuit and method of the present invention, the unwanted input compound noises are shown to have been suppressed. The SNDR (signal-to-noise-and-distortion ratio) vs. input amplitude plot is shown in FIG. 6. In this example, the peak SNDR of the nested-chopper DSM of the present invention is about 69.9 dB with about 22.05 kHz bandwidth, and about 86.3 dB with about 8 kHz bandwidth.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated in connection or interface with nested chopper 100 circuitry defined herein. Further, the manipulations performed are often referred to in terms, such as producing, identifying, determining, or comparing.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A nested chopper circuit, comprising:
   a first chopper section, the first chopper portion coupled to input terminals, the first chopper section being controlled by a pair of non-overlapping clocks; and
   a second chopper section, the second chopper section being coupled to the first chopper section, the output of the first chopper section leading to an input of the second chopper section, the second chopper section being controlled by a pair of chopper clocks;
   wherein the pair of non-overlapping clocks are multiples of the pair of chopper clocks, and the non-overlapping clocks being configured to invert on a period continuously.

2. A nested chopper circuit as recited in claim 1, wherein the nested chopper circuit is coupled to a delta-sigma modulator (DSM) circuit.

3. A nested chopper circuit as recited in claim 1, wherein the continuous inverting on the period provides sampling on positive and negative input signals provided to the input terminals of the first chopper section.

4. A nested chopper circuit as recited in claim 1, wherein the pair of non-overlapping clocks is φA and φB.

5. A nested chopper circuit as recited in claim 4, wherein the pair of chopper clocks is φ11 and φ12.

6. A nested chopper circuit as recited in claim 5, wherein the pair of chopper clocks controls switches S1, S2, S3, and S4 of the second section.

7. A nested chopper circuit as recited in claim 6, wherein switches S1, S2, S3, and S4 follow the following logic when operated in conjunction with the pair of non-overlapping clocks:
   switches S1 & S4: φA·φ11+φB·φ12; and
   switches S2 & S3: φA·φ12+φB·φ11.

8. A nested chopper circuit, comprising:
   a first chopper section, the first chopper portion coupled to input terminals, the first chopper section having two outer switches and two inner switches, the outer switches being controlled by a first non-overlapping clock and the inner switches being controlled by a second non-overlapping clock; and
   a second chopper section, the second chopper section being coupled to the first chopper section, the output of the first chopper section leading to an input of the second chopper section, the second chopper section having four switches being controlled by a pair of chopper clocks, the first and second non-overlapping clocks each being a multiple of the pair of chopper clocks, and first and second non-overlapping clocks being configured to invert on a period continuously, the inverting of the first non-overlapping clock being in opposite phase from the second non-inverting clock.

9. A nested chopper circuit as recited in claim 8, wherein the nested chopper circuit is coupled to a delta-sigma modulator (DSM) circuit.

10. A nested chopper circuit as recited in claim 8, wherein the continuous inverting on the period provides sampling on positive and negative input signals provided to the input terminals of the first chopper section.

11. A nested chopper circuit as recited in claim 8, wherein the first non-overlapping clock is φA and the second non-inverting clock is φB.

12. A nested chopper circuit as recited in claim 11, wherein the pair of chopper clocks is φ11 and φ12.

13. A nested chopper circuit as recited in claim 12, wherein the pair of chopper clocks controls switches S1, S2, S3, and S4 of the second section.

14. A nested chopper circuit as recited in claim 13, wherein switches S1, S2, S3, and S4 follow the following logic when operated in conjunction with the first and second non-overlapping clocks:
   switches S1 & S4: φA·φ11+φB·φ12; and
   switches S2 & S3: φA·φ12+φB·φ11.

15. A method for chopping an analog input signal for sampling, comprising:
   receiving an input signal;
   providing a pair of non-overlapping clocks to a first chopper section, the non-overlapping clocks configured to continuously invert on a period; and
   providing a pair of chopper clocks to a second chopper section, the non-overlapping clocks being multiples of the pair of chopper clocks, the input signal being processed through the first chopper section and the second chopper section, and the continuous inverting on the period provides sampling on a positive cycle and a negative cycle of the input signal.

16. A method for chopping an analog input signal for sampling as recited in claim 15, further comprising:

coupling an output of the second chopper section to a delta-sigma modulator (DSM) circuit.

17. A method for chopping an analog input signal for sampling as recited in claim 15, wherein the pair of non-overlapping clocks is φA and φB.

18. A method for chopping an analog input signal for sampling as recited in claim 17, wherein the pair of chopper clocks is φ11 and φ12.

19. A method for chopping an analog input signal for sampling as recited in claim 18, wherein the pair of chopper clocks controls switches S1, S2, S3, and S4 of the second section.

20. A method for chopping an analog input signal for sampling as recited in claim 19, wherein switches S1, S2, S3, and S4 follow the following logic when operated in conjunction with the pair of non-overlapping clocks:

switches S1 & S4: φA·φ11+φB·φ12; and switches S2 & S3: φA·φ12+φB·φ11.

* * * * *